(12) United States Patent
Elian

(10) Patent No.: US 7,160,670 B2
(45) Date of Patent: Jan. 9, 2007

(54) RESIST FOR FORMING A STRUCTURE FOR ALIGNING AN ELECTRON OR ION BEAM AND TECHNIQUE FOR FORMING THE STRUCTURE

(75) Inventor: Klaus Elian, Bubenreuth (DE)

(73) Assignee: Infineon Technologies AG, Munich (DE)

( * ) Notice: Subject to any disclaimer, the term of this patent is extended or adjusted under 35 U.S.C. 154(b) by 122 days.

(21) Appl. No.: 10/340,987

(22) Filed: Jan. 13, 2003

(65) Prior Publication Data
US 2003/0134228 A1 Jul. 17, 2003

(30) Foreign Application Priority Data
Jan. 11, 2002 (DE) ............................. 102 00 897

(51) Int. Cl.
*G03F 7/004* (2006.01)
*G03F 7/20* (2006.01)
(52) U.S. Cl. ................ 430/312; 430/296; 430/942; 430/945; 430/270.1
(58) Field of Classification Search ............ 430/315, 430/312, 296, 942, 945, 270.1
See application file for complete search history.

(56) References Cited

U.S. PATENT DOCUMENTS

| | | | | |
|---|---|---|---|---|
| 5,229,254 A | * | 7/1993 | Lohaus et al. | 430/281.1 |
| 5,262,283 A | * | 11/1993 | Sezi et al. | 430/325 |
| 5,851,733 A | * | 12/1998 | Sezi et al. | 430/311 |
| 5,892,230 A | | 4/1999 | Goodberlet et al. | |
| 6,171,755 B1 | | 1/2001 | Elian et al. | |
| 6,210,856 B1 | * | 4/2001 | Lin et al. | 430/270.1 |
| 6,251,558 B1 | * | 6/2001 | Elian et al. | 430/270.1 |
| 6,432,608 B1 | * | 8/2002 | Fujie et al. | 430/270.1 |
| 6,506,535 B1 | * | 1/2003 | Mizutani et al. | 430/270.1 |
| 6,716,573 B1 | * | 4/2004 | Fujie et al. | 430/326 |

FOREIGN PATENT DOCUMENTS

WO 97/34201 9/1997

OTHER PUBLICATIONS

Stefan Hien et al.: "Dual-Wavelength Photoresist for Sub-200 nm Lithography", *SPIE 1998*, vol. 3333, pp. 154-164.
Hien, S. et al.: "Thin Film Imaging with CARL© Photoresist at the Optical Resolution Limit", Proc. SPIE, vol. 3333, 1998, pp. 154-164.
Elian, K. et al.: "Sub Quarter-Micron Bilayer Electron Beam Resist with Enhanced Sensitivity", Elsevier Microelectronic Engineering 45, 1999, pp. 319-327.
Goodberlet, J. et al.: "Scintillating Global-Fiducial Grid for Electron-Beam Lithography", J. Vac. Sci. Technol. B16(6), Nov./Dec. 1998, pp. 3672-3675.

* cited by examiner

*Primary Examiner*—Amanda Walke
(74) *Attorney, Agent, or Firm*—Laurence A. Greenberg; Werner H. Stemer; Ralph E. Locher

(57) ABSTRACT

A scintillating structure for aligning an electron or ion beam using a detector while exposing a wafer, which may be a wafer or mask, is described. The structure is formed by a resist including a polymer with carboxylic acid groups, anhydride groups, and an acid-sensitive group, for instance tert.-butylester; a photoreactive compound which releases an acid upon irradiation with UV light, electrons, or ions; a solvent; and at least one scintillating substance such as anthracene, naphthaline and/or 1,4-bis-(5-phenyl-2-oxazolyl)-benzol. After a developing and silylating step, the cross-linked structure is inert with respect to solvents of additional resists that are applied over the structure. The scintillating structure is thus not dissolved, which improves the quality of online controlled electron or ion beam writing.

12 Claims, 2 Drawing Sheets

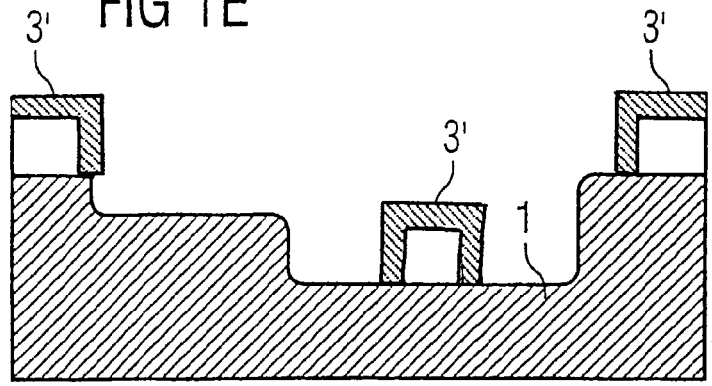
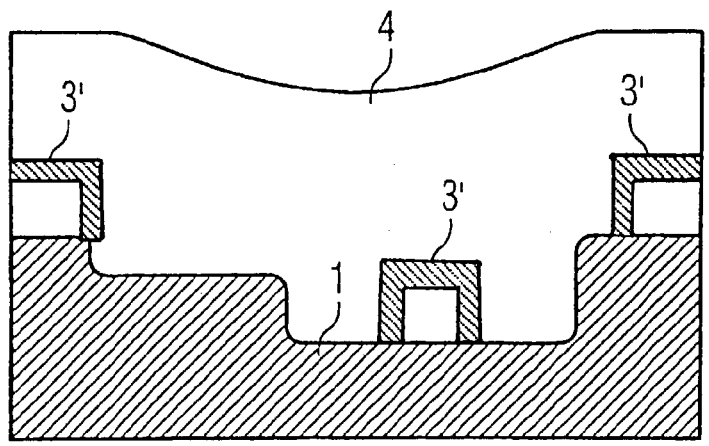
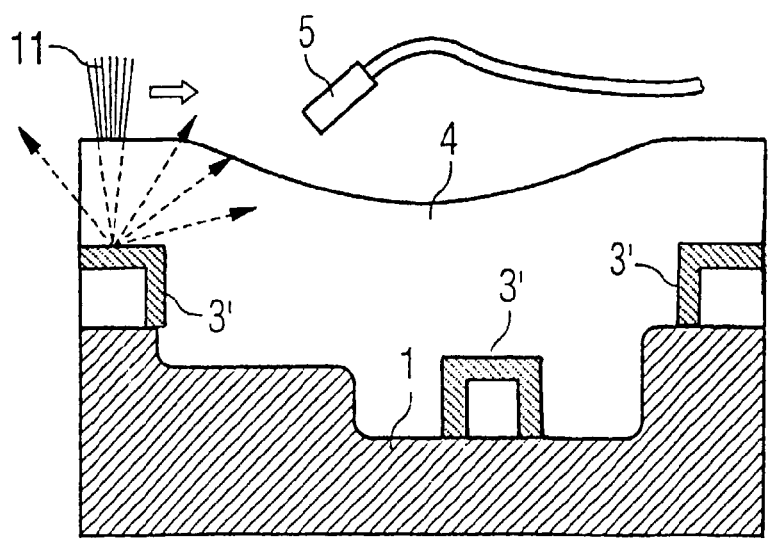

RESIST FOR FORMING A STRUCTURE FOR ALIGNING AN ELECTRON OR ION BEAM AND TECHNIQUE FOR FORMING THE STRUCTURE

BACKGROUND OF THE INVENTION

Field of the Invention

The invention relates to a resist for forming a structure for aligning an electron or ion beam during the exposing of a wafer, and a technique for forming the structure.

Electron beam lithography is a common technique for forming structures on semiconductor wafers, masks, reticules, or flat panel displays. Electron beam lithography is utilized primarily for structuring photosensitive masks because of the low minimal structural widths and the associated long write times that can be achieved by this technique. Given structure widths under 100 nm, write times of up to 15 hours are not uncommon with contemporary electron beam exposure devices. This can lead to the problem that the environmental conditions and the device parameters can also change within the write times. As a result, deviations may occur during the write time in the position and intensity of the electron beam, which is typically in alignment at the immediate start of the write time. Given particularly small structures, this results in degraded resolution. It may thus be impossible to satisfy positional accuracy requirements.

One way out of this problem is to realign the electron beam—or the wafer on the stage, or the mask—at regular intervals. For instance, the mask is partitioned into structural sections, and for each section, a specified aligning mark is approached. The electron beam is reoriented at this mark. The disadvantage of this is that productivity is lost in the aligning process due to the long movement times of the mask stage or wafer stage. It is also impossible to take into account sudden jumps in environmental conditions in a timely fashion.

Goodberlet (J. Vac. Sci. Technol. B 16(6), November/December 1998: 3672–75) and U.S. Pat. No. 5,892,230 propose a new technique according to which a grid structure containing scintillating material is structured onto the mask or wafer, which serves for later position measurement. When the electron beam crosses such a grid structure during the rastering of position addresses on the wafer (or mask, etc.), the energy entries in the scintillating material of the grid are converted into light emission, approximately in the optical spectral region, by the electrons. A specially configured detector receives the light emission, so that in a control unit of the electron beam exposure system, the address position of the electron beam that is being written, can be compared to the actual position according to the scintillating grid. This comparison can be performed online, i.e. while the electron beam is still at the corresponding raster position, and in situ, so that if a deviation is detected between the positions, the necessary correction of the electron beam can occur immediately at the location of the current raster address. In particular, it is no longer necessary to move to aligning marks in the sub-portion of the structure of the mask or wafer in regular fashion.

According to the prior art, scintillators are provided in organic or inorganic form. The scintillating structure is formed by adding the scintillator to an organic resist and then structuring the resist in a separate processing step of the electron beam writer. Instead of the structure that is formed in the resist being transferred to an underlying layer in an etching step like in conventional structure formation with resists, in this case the scintillating resist initially remains after being structured as a positioning grid and is covered by an additional resist. This covering resist corresponds to the actual structuring layer, whereby the structure formed therein by the electron beam is transferred to the underlying layer in an etching step. The intermediate scintillating resist layer serves as an aligning grid for online controlled writing with the electron beam.

A problem that has yet to be resolved is that the resist that is deposited later can dissolve the previously structured scintillator resist. This is because the scintillating layer is not inert to the solvent contained in the subsequently deposited varnish. The additionally deposited resist thus damages the grid structure of the scintillator layer, which serves as an alignment marker, and it thereby reduces the alignment precision in online controlled electron beam writing.

SUMMARY OF THE INVENTION

It is accordingly an object of the invention to provide a resist and a method for forming a structure for aligning an electron beam or ion beam in the exposing of a wafer, which overcomes the above-mentioned disadvantages of the prior art resists and methods of this general type.

With the foregoing and other objects in view there is provided, in accordance with the invention, a resist for forming a structure for aligning an electron beam or an ion beam when exposing a wafer, including a polymer anhydride group and at least one of the following acid-sensitive groups: tert.-butylester-, tert-butoxicarbonyloxi-, tetrahydrofuranyl-, or tetrahydropyranyl groups; a photoreactive compound which releases an acid upon irradiation with UV light, electrons, or ions; a solvent; and at least one scintillating substance. The polymer can also include carboxylic acid.

With the foregoing and other objects in view there is provided, in accordance with the invention, a method for forming a structure for aligning an electron or ion beam when exposing a wafer, including the following steps: preparing a resist material of the above described composition; depositing the resist material onto the wafer, forming a first resist on the wafer; desiccating the first resist; irradiating a portion of the resist surface for forming the structure in the first resist, photolytically forming an acid in the irradiated portion; baking the resist until the acid formed in the irradiated portion breaks down the acid-sensitive group in the polymer; developing the resist by removing the separated polymer components in the irradiated portion for forming the structure in the resist, and silylating the structure in the resist.

The inventive resist is what is known as a chemically reinforced resist to which at least one scintillating substance is added. The particular advantage of the inventive chemically reinforced resist is that a chemical cross-linking of the resist is performed by the additional silylation step, and after this step this resist is inert, i.e. insoluble with respect to the solvents of the subsequently deposited additional resists. Such resists are described by Hien (Proc. SPIE Vol. 3333 (1998):154–64) or Elian (Microelectronic Engineering 45 (1999):319–27), but only for utilization as a thin top resist film in a two-layer resist. Such a thin top resist lies on a thick planarising bottom resist, which is deposited previously and therefore possesses the particularly advantageous characteristic of enlarging the processing window for the exposure parameters compared to the focus settings of the exposure system. In the conventional two-layer resist, the thin top resist is first exposed and developed. Next, it undergoes silylation. In the silylation step, the structures that remained in the thin top resist after the developing step are treated with a slightly volatile alcoholic silylation solution, whereby the siloxanes contained therein diffuse into the resist and are ultimately cross-linked into the polymer matrix of the resist. The increased silicon content in the remaining resist structures has an enhanced etch resistance, so that, in a subsequent dry development step, the structure of the top resist can be transferred through the bottom resist onto the underlying layer, which is actually being structured, with high dimensional stability.

The solvent resistance of the top resist in the two or more resist layers is inventively exploited for purposes of forming a resist directly on the wafer or mask surface, which can be covered by additional varnishes with arbitrary solvents. With such material as has been utilized hitherto only as a top varnish, the invention makes possible an application for forming scintillating aligning marks. The chemically reinforced resist utilized therein is solvent resistant, so that a second resist which serves for the actual structuring can be deposited on the scintillating resist layer without causing damage to the scintillating resist layer.

A further advantage is the ability to carry out what is known as chemical biasing with a chemically reinforced resist. Specifically, in the silylation step, the remaining structures in the top resist swell in the cross-linking process, so that the intermediate regions which are cleared in the developing step become narrower in a controlled fashion. That way, very small structure widths can be generated. This advantage can also be exploited for the inventive aligning marks.

Because it is unnecessary to account for dissolving or intermixing problems in the chemically cross-linked resist, as opposed to the conventional resist solvents, any additional varnish can be applied to the scintillating resist.

In another development of the resist, the scintillating substance is an organic chemical compound. The advantage of this is that the substance integrates easily in chemically reinforced resists that are currently provided for a silylation step.

In another development, the scintillating substance is anthracene. Anthracene is particularly photosensitive and thus a particularly suitable scintillator.

In another development, the scintillating substance is 1,4-bis-(5-phenyl-2-oxazolyl)-benzol. This substance is particularly well suited because it emits the absorbed energy in a wavelength region in which the overlying resist is substantially transparent, so that the detector can detect when the electron beam passes over the scintillating resist grid.

In another development, the scintillating substance is naphthaline. This substance is particularly well suited for absorbing the electron energy and transmitting it to the other scintillating substances.

In another development, the scintillating material contains an anorganic compound. Advantageous examples are: thallium-doped sodium iodide, sodium-doped caesium iodide or europium-doped calcium fluoride, which emit in the optical spectral region.

In another development of the method, the silylation step is performed by immersing the resist-coated wafer (i.e. the wafer, the mask, the reticule, the flat panel display, etc.) in a solution with bisaminopropyl oligodimethylsiloxane. A 2–5% solution produces particularly favorable concentrations for diffusion of the siloxanes into the resist matrix.

In another development, a rinsing and drying step is performed after the silylation.

In another development, after the silylation—or, given a rinsing and drying step, after that step—a second resist is deposited on the first resist, which serves for lithographically structuring a layer on the wafer under the first resist.

In another development of the method, the irradiation for forming the structure or the aligning mark in the scintillating resist is carried out using an electron or ion beam.

In another development of the method, the irradiation is performed using a laser beam.

In another development of the method, the irradiation is performed using photo-optical projection through a mask. This means that the scintillating resist grid structure is created particularly advantageously in a fast and efficient photo-optical projection, whereas the actual structuring in the second deposited resist is performed with high quality with an electron beam. The quality is improved specifically by the online controlled writing using the scintillator grid.

Other features which are considered as characteristic for the invention are set forth in the appended claims.

Although the invention is illustrated and described herein as embodied in a resist for forming a structure for aligning an electron or ion beam and a technique for forming the structure, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1A–1G are schematic views illustrating individual steps for forming and utilizing an inventive structure for aligning an electron beam.

DESCRIPTION OF THE PREFERRED EMBODIMENTS

Figure 1A:
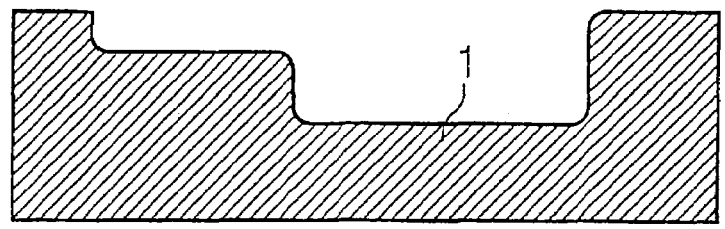
Figure 1B:
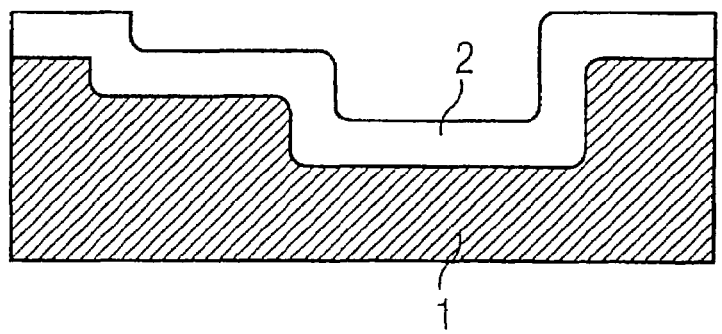

Referring now to the figures of the drawing in detail, there is shown a first exemplary embodiment of the invention in which, a structure for aligning an electron beam on a silicon wafer is formed and utilized with the inventive resist and by the inventive method. FIG. 1A represents the silicon wafer after it has already been provided with a surface morphology, stemming from prior processing steps. An arbitrary structure will be incorporated into the surface using an electron beam and a resist mask. Because of the requirement that the structural widths be very small in this example, the write times are very long, and so a scintillating aligning grid is installed. To that end, a first resist 2 is deposited. As a carrier matrix, this contains 8.57 g of a terpolymer which is obtained by the radical copolymerization of malein acid anhydride with methacryl acid—tert-butylester and allylsilane. The resist 2 also contains 0.42 g of a photoreactive compound, i.e. an acid former, for which triphenylsulfoniumhexafluorpropanesulfonate is utilized. This is dissolved in 100 g methoxipropylacetate as a solvent. As scintillating substances, 0.44 g naphthaline, 0.13 g anthracene, and 0.13 g 1,4-bis-(5-phenyl-2-oxazolyl)-benzol are added. The resist 2 so fabricated is spun onto the silicon wafer 1 for 20 seconds at a rate of 2,000 r.p.m. and then dried on a hot plate at 120° C. for 60 seconds. The layer thickness of the resist 2 in the state shown in FIG. 1B is now 210 nm.

Figure 1C:
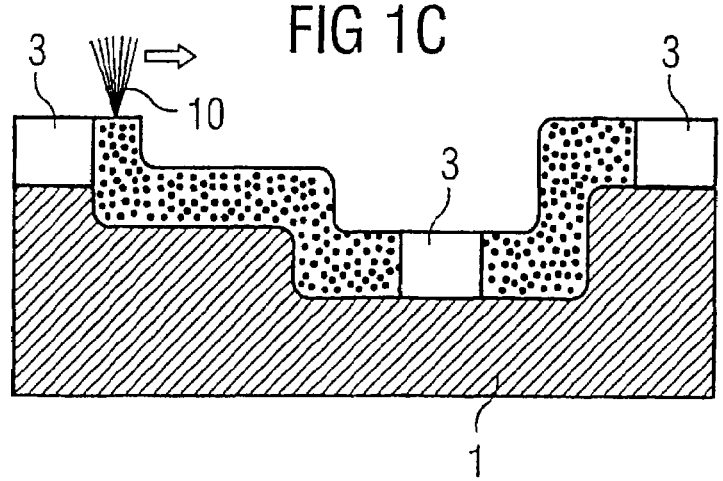

The wafer, now coated with the resist 2, is structured in an electron microscope JSM 840A (Jeol) in connection with a Sietec Nanobeam pattern generator using an acceleration voltage of 30 kV. The aligning structures 3 that will be generated remain unexposed by the electron beam 10 as shown in FIG. 1C.

The polymer chain of the terpolymer contains the anhydride, which is responsible for the silylation, as well as a carboxylic acid group which emerges in alcoholyse and which is suitable for adhesion and development characteristics, and the acid-sensitive tert.-butylester group which is responsible for the exposure. With the irradiation, an acid is photolytically formed by the photoreactive compound, the acid former. The acid breaks down the tert.-butylester group in the polymer. The process is intensified by heating on a hot plate at 120° C. for 120 seconds (post exposure bake). The polar carboxylic acid group that was previously blocked in the terpolymer is thereby unblocked, that is to say released.

Figure 1D:
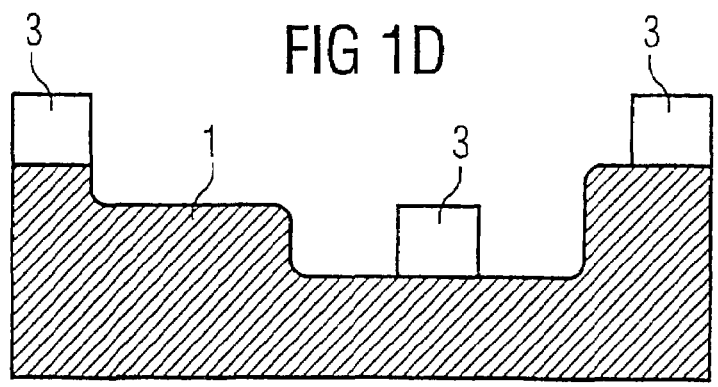

By immersion-developing with a duration of 60 seconds in a TMA 238 WA developer (JSR Electronics), the carboxylic acid groups are dissolved in the exposed regions and removed together with the separated polymer components as shown in FIG. 1D.

A silylation step is carried out by immersing the developed structures for 40 seconds in a solution of 2% bisaminopropyl-oligodimethylsiloxane in 1-hexanol. In the silylation, the anhydrides that are embedded in the polymer chains of the terpolymer bond with the amino components of the siloxane. Silicon groups are thereby permanently incorporated in the matrix of the terpolymer. At the same time, growth occurs based on the acceptance of the amino siloxane into the cross-linked silylated structures 3', as shown in FIG. 1E. Next, the wafer 1 is rinsed for 20 seconds with isopropanol and blown dry with compressed air.

Once treated, the structure is insoluble in the conventional resist solvents and is now covered with an additional second resist 4, as represented in FIG. 1F. Using an electron beam, the resist 4 is now provided with the actual structure that will be transferred onto the wafer 1. When the electron beam 11 which is utilized in this step passes over the resist 4 at the location where a structure 3' is located under the resist, the structure absorbs the electron energy and emits light in the wavelength region of 400 to 500 nm. The resist 4 is transparent to light of this wavelength and is photo-insensitive. As shown in FIG. 1G, the emitted light reaches a detector 5, which is flanged as a photo-multiplier. Address coordinates that are presently being written (e.g. from a memory) can be compared to the coordinates provided for the structures 3' in order to be able to perform corrections at the electron beam if a difference is detected.

In another exemplary embodiment, the same resist 2 as in the first exemplary embodiment is utilized. The processing is also identical to that in the first example. In contrast to the first example, however, the scintillating resist is exposed not by electron radiation, but by UV exposure at a wavelength of $\lambda=250$ nm using a structured photosensitive mask. The exposure apparatus is the MJB3 system (Karl Süss GmbH). The photosensitive mask is a chrome on glass mask (Ditric Optics). Test structures in the dimensional range between 1 and 10 µm are present on these. Furthermore, the mask is covered with a bandpass filter that is permeable for 250 nm+/−10 nm. The bandpass filter is manufactured by Schott. This method also produces structures that can be utilized for the desired online control in electron beam writing.

It is particularly advantageous to combine the three scintillator materials that are utilized in these exemplary embodiments, given their suitability for (a) absorbing the radiated energy, (b) transmitting the energy to another scintillator material, and (c) emitting the energy in another wavelength—which, in interplay with the overlying resist 4, makes possible the transparence of the resist without exposing it.

I claim:

1. A method for forming a structure for aligning an electron beam or an ion beam when exposing a wafer, the method which comprises:
   preparing a resist material including: a polymer including anhydride groups and at least one acid-sensitive group selected from a group consisting of a tert.-butylester group, a tert.-butoxycarbonyloxy group, a tetrahydrofuranyl group, and a tetrahydropyranyl group; a photoreactive compound releasing an acid upon irradiation with UV light, electrons, or ions; a solvent; and at least one scintillating substance;
   depositing the resist material on the wafer, thereby forming a first resist on the wafer;
   desiccating the first resist;
   irradiating a portion of the first resist for forming the structure in the first resist and thereby photolytically forming an acid in the irradiated portion of the first resist;
   baking the first resist to break down the acid-sensitive group in the polymer using the acid that was formed in the irradiated portion of the first resist;
   developing the first resist by removing separated polymer components in the irradiated portion for forming the structure in the first resist;
   silylating the structure in the first resist;
   depositing a second resist on the first resist, the second resist covering the structure formed in the first resist containing the at least one scintillating substance; and
   irradiating the second resist with an electron beam or an ion beam such that an amount of energy is absorbed by the scintillating substance in the first resist and emitted at a different wavelength thereby indicating a position of the electron beam or ion beam on the wafer.

2. The method according to claim 1, wherein the silylating step is performed by immersing the wafer that has been coated with the first resist in a solution including bisamino propyl oligodimethylsiloxane.

3. The method according to claim 1, which comprises performing a rinsing and drying step after the silylating step.

4. The method according to claim 1, which comprises:
   after the rinsing and drying step, depositing the second resist on the first resist, the second resist for lithographically structuring a layer on the wafer under the first resist.

5. The method according to claim 1, which comprises:
   after the silylating step, depositing the second resist on the first resist, the second resist for lithographically structuring a layer on the wafer under the first resist.

6. The method according to claim 1, which comprises using an electron beam or an ion beam to perform the irradiating step on the first resist.

7. The method according to claim 1, which comprises using a laser beam to perform the irradiating step on the first resist.

8. The method according to claim 1, which comprises performing the irradiating step on the first resist by photo-optically projecting the radiation through a mask.

9. The method according to claim 1, wherein the wafer is selected from a group consisting of a semiconductor wafer, a mask, a reticle, and a flat panel display.

10. The method according to claim 1, which further comprises:
   aligning the electron beam on the wafer in dependence on the indicated position.

11. The method according to claim 1, which further comprises performing the silylating step using a siloxane including amino-groups thereby reacting the anhydride groups of the first resist with amino groups of the siloxane.

12. A method for forming a structure for aligning an electron beam or an ion beam when exposing a wafer, the method which comprises:
   preparing a resist material including: a polymer including anhydride groups and at least one acid-sensitive group selected from a group consisting of a tert.-butylester group, a tert.-butoxycarbonyloxy group, a tetrahydrofuranyl group, and a tetrahydropyranyl group; a phororeactive compound releasing an acid upon irradiation with UV light, electrons, or ions; a solvent; and at least one scintillating substance;
   depositing the resist material on the wafer, thereby forming a first resist on the wafer;
   irradiating a portion of the first resist for forming the structure in the first resist;
   developing the first resist for forming an aligning structure for an electron beam;
   silylating the aligning structure in the first resist;
   depositing a second resist on the first resist, the second resist covering the aligning structure formed in the first resist;
   irradiating the second resist with an electron beam, the aligning structure of the first resist emitting light when absorbing energy of the electron beam thereby indicating an indicated position of the electron beam on the wafer; and
   aligning the electron beam in dependence on the indicated position, if necessary.

* * * * *